United States Patent [19]

DeRemer et al.

[11] 4,025,908
[45] May 24, 1977

[54] DYNAMIC ARRAY WITH CLAMPED BOOTSTRAP STATIC INPUT/OUTPUT CIRCUITRY

[75] Inventors: Ronald Lyle DeRemer, Rochester; Dale Arthur Heuer, Stewartville, both of Minn.

[73] Assignee: International Business Machines Corporation, Armonk, N.Y.

[22] Filed: June 24, 1975

[21] Appl. No.: 589,801

[52] U.S. Cl. .................... 340/173 CA; 340/166 R
[51] Int. Cl.² ....................................... G11C 11/44
[58] Field of Search ............. 340/173 PP, 173 CA, 340/166 R

[56] References Cited
UNITED STATES PATENTS

| | | | |
|---|---|---|---|
| 3,691,535 | 9/1972 | Williams | 340/173 PP |
| 3,810,124 | 5/1974 | Hoffman et al. | 340/173 CA |
| 3,851,313 | 11/1974 | Chang | 340/173 CA |
| 3,876,993 | 4/1975 | Cavanaugh | 340/173 CA |
| 3,892,984 | 7/1975 | Stein | 340/173 CA |
| 3,924,247 | 12/1975 | Spence | 340/173 CA |

*Primary Examiner*—Marshall M. Curtis

[57] ABSTRACT

A read only memory is organized as a matrix of field effect transistors wherein logic levels are determined by the presence or absence of a gate which permits transistor action. The memory is addressed using a gate decode tree which selects the gates of a column of matrix devices and a source decode tree which selects the source lines of a row of matrix devices. Sensing of the logic level at a selected location is accomplished by a change of state output sense circuit which dynamically senses and provides a static output using a polarity hold circuit. Clamped, boot-strapped inverter circuits are provided in both input and output circuitry to maintain voltage, at selected internal nodes at a voltage intermediate predetermined minimum and maximum values.

8 Claims, 11 Drawing Figures

DYNAMIC ARRAY WITH CLAMPED BOOTSTRAP STATIC INPUT/OUTPUT CIRCUITRY

SUMMARY OF THE INVENTION

This invention pertains to permanent storage devices and more particularly to high density read only storage devices and circuitry for the implementation thereof.

Permanent data storage devices for implementing such functions as device control have been found to be the most cost effective means for accomplishing such functions using field effect transistors (FET) as storage devices and metal oxide semiconductor (MOS) technology. To optimize the usefulness of such devices it is an objective to place on one chip of large scale integration circuitry the greatest possible number of storage locations along with accompanying addressing, clocking and sensing circuits. To accomplish such an objective it is necessary that the circuitry operate reliably and effectively; that the design limit heat and power dissipation which would restrict density and device life and further might require additional equipment for cooling and temperature maintenance; and that the circuitry of the memory interface properly with the static logic circuitry with which the memory must interface and function.

In the permanent storage device of the present invention a dynamic array of storage positions arranged in rows and columns of storage positions is addressed by static circuitry and provides a latched static output.

The effectiveness and reliability of the input circuitry addressing the columns of storage positions and the output latches is assured by the provision of bootstrapped driver circuits to assure a minimum operating voltage. In addition, these driver circuits are clamped by including an additional FET device which precludes such circuit from exceeding a predetermined upper voltage level. The circuitry utilizes largely charge transfer in accessing and sensing to minimize the DC current flow and the provision of decode trees with respect to both column select and source line row select address functions minimizes both the number of devices required and the number of conducting paths during operation. The decode tree serves not only to materially reduce the number of devices for the function, but also affords the restriction of conductivity to a single conductive path that appears as a single device to the system. At the output, the clocked dynamic circuit is sensed to determine the logic level at the selected position within the matrix and such logic level is utilized by clocked, sense and reset circuitry to condition a polarity hold output latch circuit to provide a static condition that remains valid until reset during the next memory access cycle.

DETAILED DESCRIPTION

Figure 1:
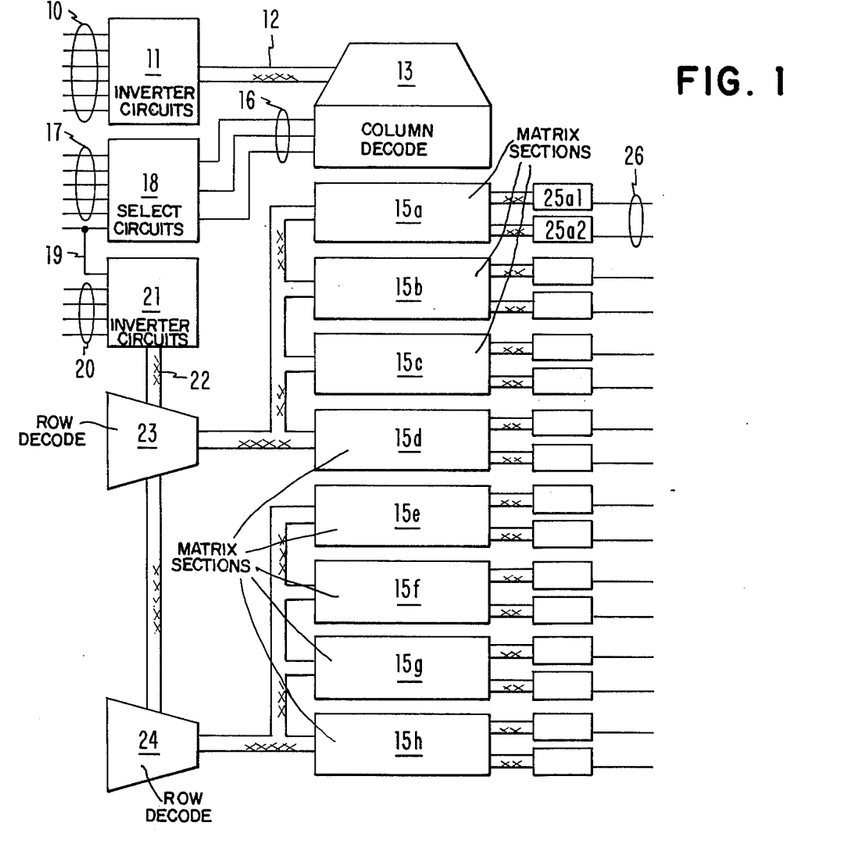
FIG. 1 is a block diagram of the read only storage permanent memory of the present invention which illustrates the general organization.

FIG. 1 illustrates schematically the memory array, addressing circuits and sensing circuits of the read only memory. Six address lines 10 are modified to provide true and complement signals by inverter circuitry 11 and transmitted over a data path 12 to a gate decode tree 13 which serves to select one of 64 gate lines leading to the memory array portions 15a through 15h. Memory matrix sections 15a through 15h include three arrays one of which may be selected by a positive signal on a selected one of the lines 16. Five address lines 17 are decoded by array select circuitry 18 to determine whether one of the three lines 16 is to be selected. The five lines 17 may be decoded to identify 32 arrays, three of which are contained in the matrix circuitry of FIG. 1 and selected by one of the lines 16.

An address line 19 may be utilized in either of two modes depending on the design of the large scale integration (LSI) chip before manufacture. If eight bit words are utilized, line 19 functions to identify whether the upper half of the array, sections 15a through 15d are utilized or whether the lower half of the array, sections 15e through 15h are utilized. The alternative mode of operation is the use of 16 bit words in which case line 19 is connected to the array select circuitry 18 to afford a selection capability of 64 arrays. Four address lines 20 connect to inverter circuitry 21 to generate true and complement lines which on the data path 22 are directed to a pair of source decode tree circuits 23 and 24. Each of the source decode tree circuits 23 and 24 has a 16 line output one of which is selected. Each of the 16 output lines grounds a source line serving two rows in each of the four matrix sections to which it is connected.

The gate decode tree circuitry 13 in combination with the array select circuit 18 (when one of the three arrays on the chip is selected) selects a single column of FET memory location extending through the matrix sections 15a through 15h. The source decode tree circuitry 23 and 24 selects a single source line in each of the matrix sections 15a through 15h whereby the intersection of the column gate decode and the row source line decode combine to identify 16 memory bit locations, two in each of the eight memory matrix sections. Each selected source line identifies two bit positions within the selected column which are sensed by a pair of output circuits 25a1 and 25a2 which provide the output signal on a pair of lines 26.

Figure 2:
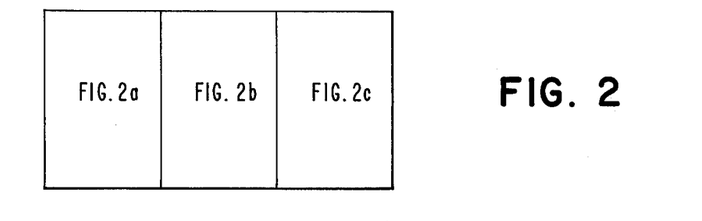
FIG. 2 consisting of FIGS. 2a, 2b and 2c collectively shows the permanent memory of FIG. 1 at a NAND-NOR logic level with portions shown schematically and other portions shown by representative circuit elements.
Figure 3:
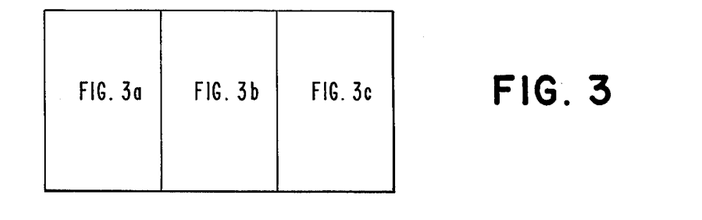
FIG. 3 consisting of FIGS. 3a, 3b and 3c shows the permanent memory of FIG. 1 at the device level with representative circuits or circuit portions utilized for illustrative purposes and with the array being interrupted both horizontally and vertically.

Referring to FIGS. 2 and 3, the column gate decode address is effected by six address lines 10 one of which is shown. Each address line is directed sequentially through two inverter circuits 28 and 29 to provide a true value on line 30 and a complement on line 31. Each of the inverter circuits includes a clamped, bootstrapped circuit utilizing field effect transistor (FET) devices A, B, and C to maintain a voltage and internal node 32 at a level that is above a lower threshold voltage but does not exceed an upper limiting voltage. The device C has an output electrode 33 and a second electrode 34 connected to voltage source V with a capacitor 35 connected intermediate the gate connection 36 and output electrode 33. Device A has the gate 37 and drain 38 connected to the voltage source V and the source electrode 39 connected to the gate connection 36 of device C. The clamping function is provided by device B which has the source 40 connected to voltage V and the gate 41 and drain 42 thereof connected to the gate electrode 36 of device C. Device A is present to maintain minimum voltage at the internal node 32 equivalent to the voltage V minus the voltage across device A. Device B serves to insure that the internal node voltage never exceeds the voltage of source voltage V plus the voltage across device B. Capacitor 35 is an enhancement of the gate to source capacitance of device C and is the boot-strap capacitor. If the input or clock forces the output into an upward transition, the capacitor 35 redistributes the charge to the internal node until device B turns on. This operation gives device C a gate voltage V plus the voltage across device B and allows an output voltage V.

The address signal on line 10 is inverted to provide the complement signal on line 31 and is again inverted to provide the true signal on line 30.

Figure 3B:
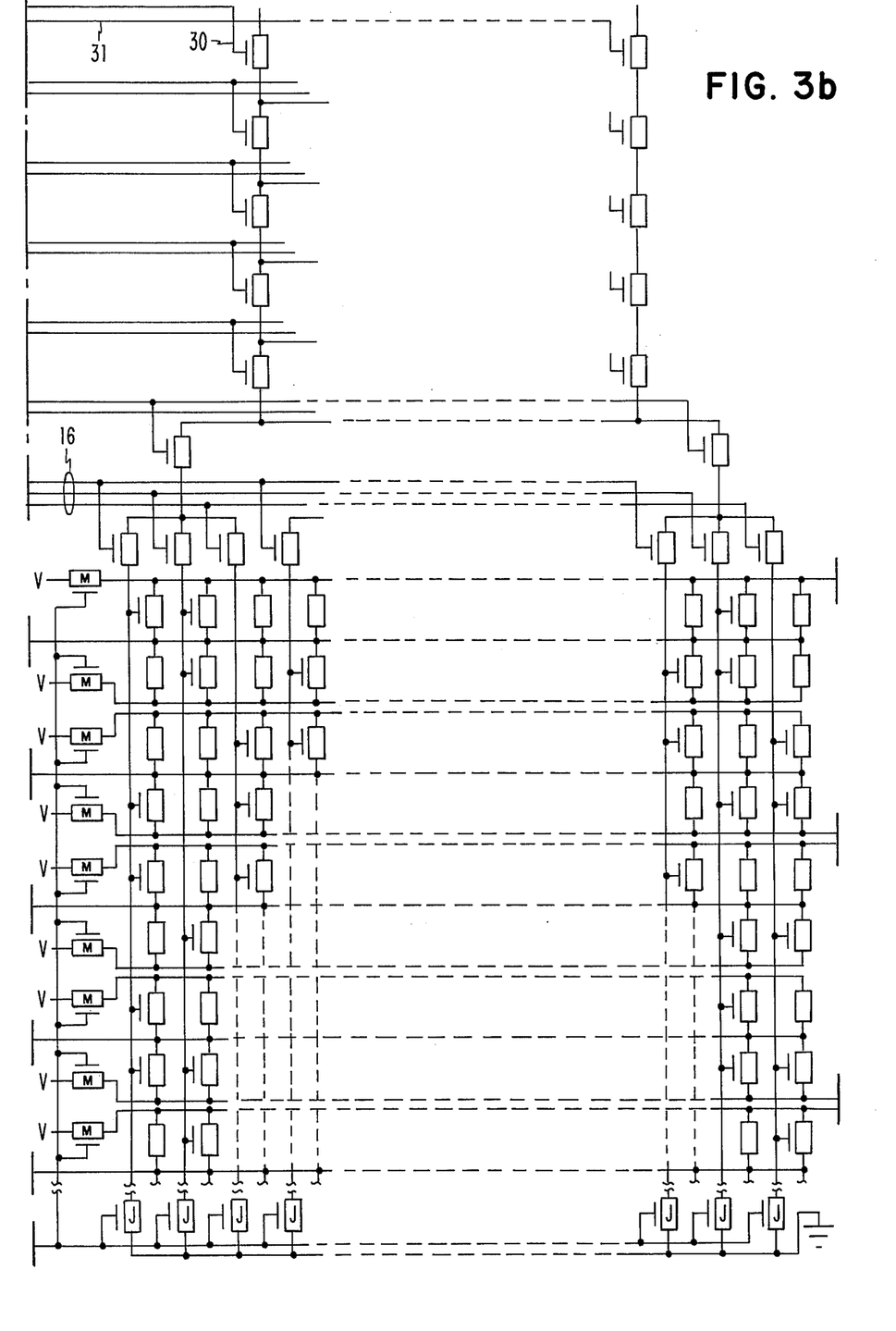
Figure 4:
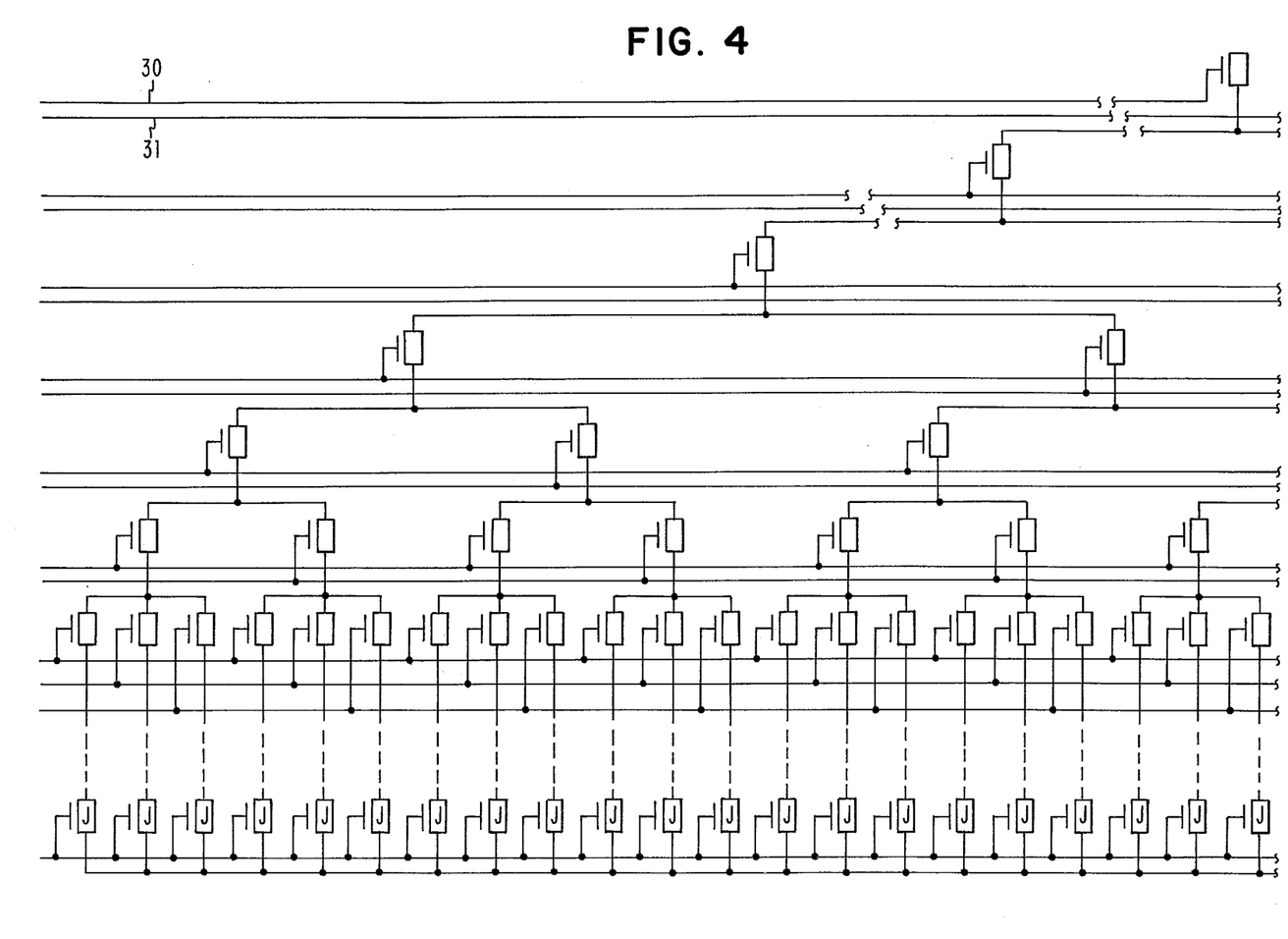
FIG. 4 is a view of the gate or column decode tree of FIGS. 1, 2b and 3b partially broken away.

The true and complement outputs on the six pairs of lines which form the data path 12 and of which lines 30 and 31 are a representative pair are directed to a series of gate connections in the gate decode tree to in effect provide a series of 64 AND blocks 44 having mutually exclusive combinations whereby one of 64 sets of three columns of gates are selected by each of the combinations of the six address lines 10. Within each of the groups of three columns selected by one of the 64 address combinations, one of three array address lines 16 selects a single gate connection column to complete selection of one of the 192 columns of devices to be addressed. Although in FIG. 2 the arrays are shown sequentially for the purpose of a simplified schematic representation, array 1 is in fact as shown in FIG. 3b composed of each third column beginning with the first column on the left, array 2 consists of each third column beginning with the second column on the left and array 3 consists of each third column beginning with the third column on the left whereby each array column is interdigitated between a column of devices of each of the other two arrays. Although the column select as schematically illustrated in FIGS. 2 and 3 for the gate decode is shown effectively as a series of AND blocks, the actual decode tree exists as is partially shown in FIG. 4 where the uppermost pair of true and complement lines 30 and 31 are each directed to the gate connections of one FET device. The second pair to two devices each until the sixth pair has each line connected to 32 gate connections. As shown, the gate decode tree plus the array select lines provide the decode of six address lines and three array select lines in order to address 192 possible column locations. Further, because of the binary state of the lines and devices, only one path in the entire tree is dissipating power. The devices N at the lower end of the array are used to clear the decode tree of any miscellaneous charge stored in the tree.

Figure 2A:
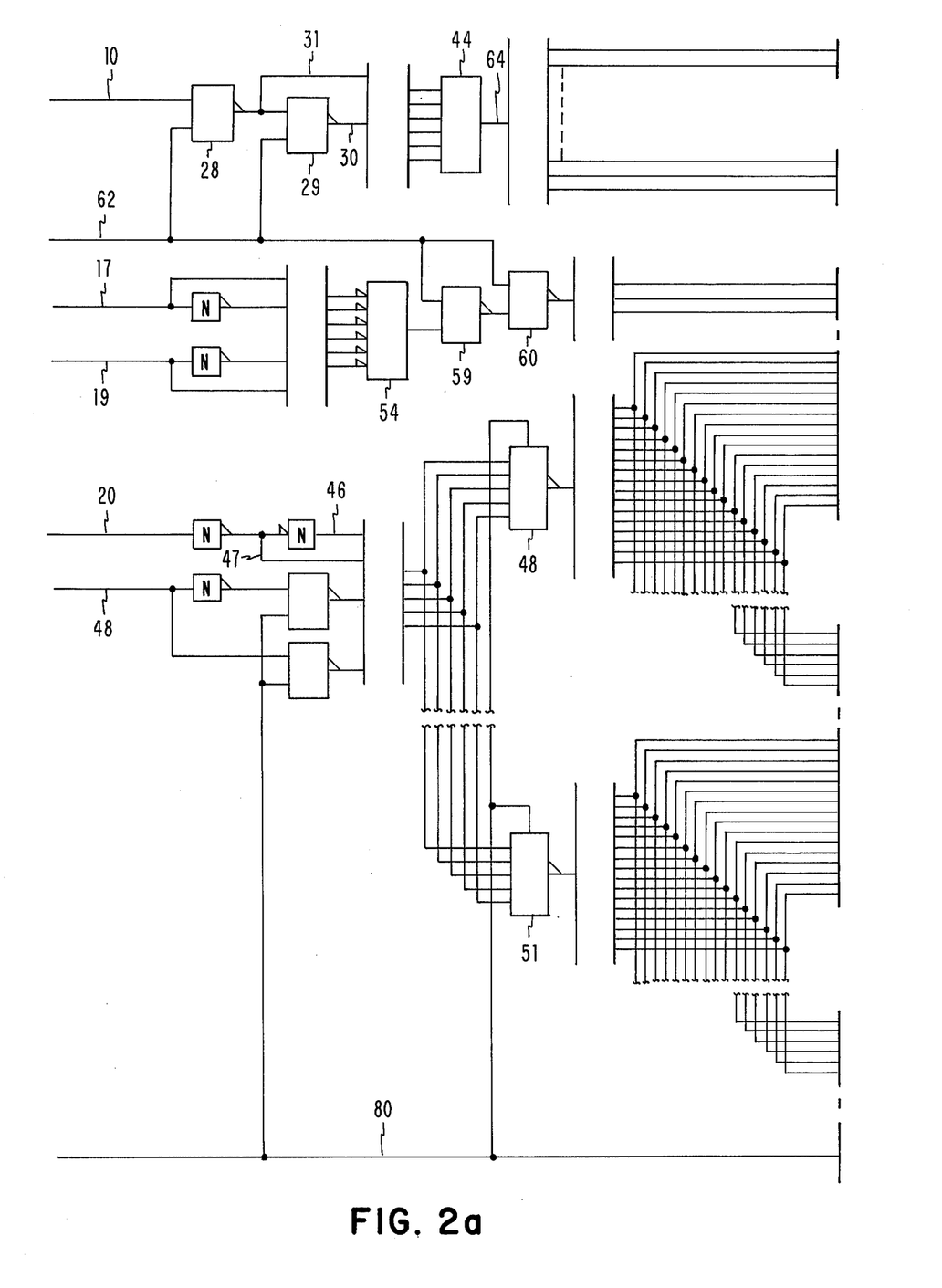
Figure 2B:
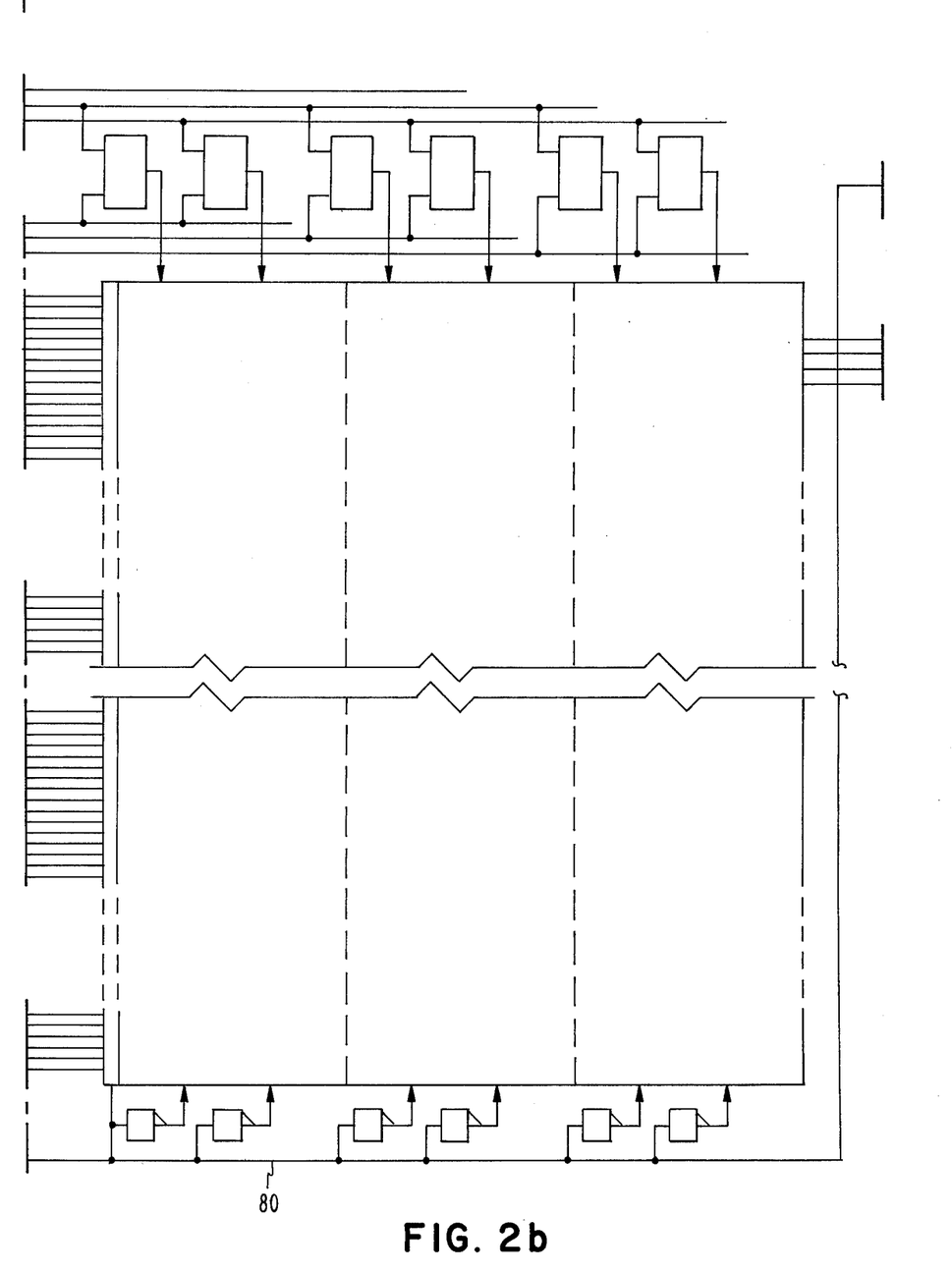
Figure 3A:
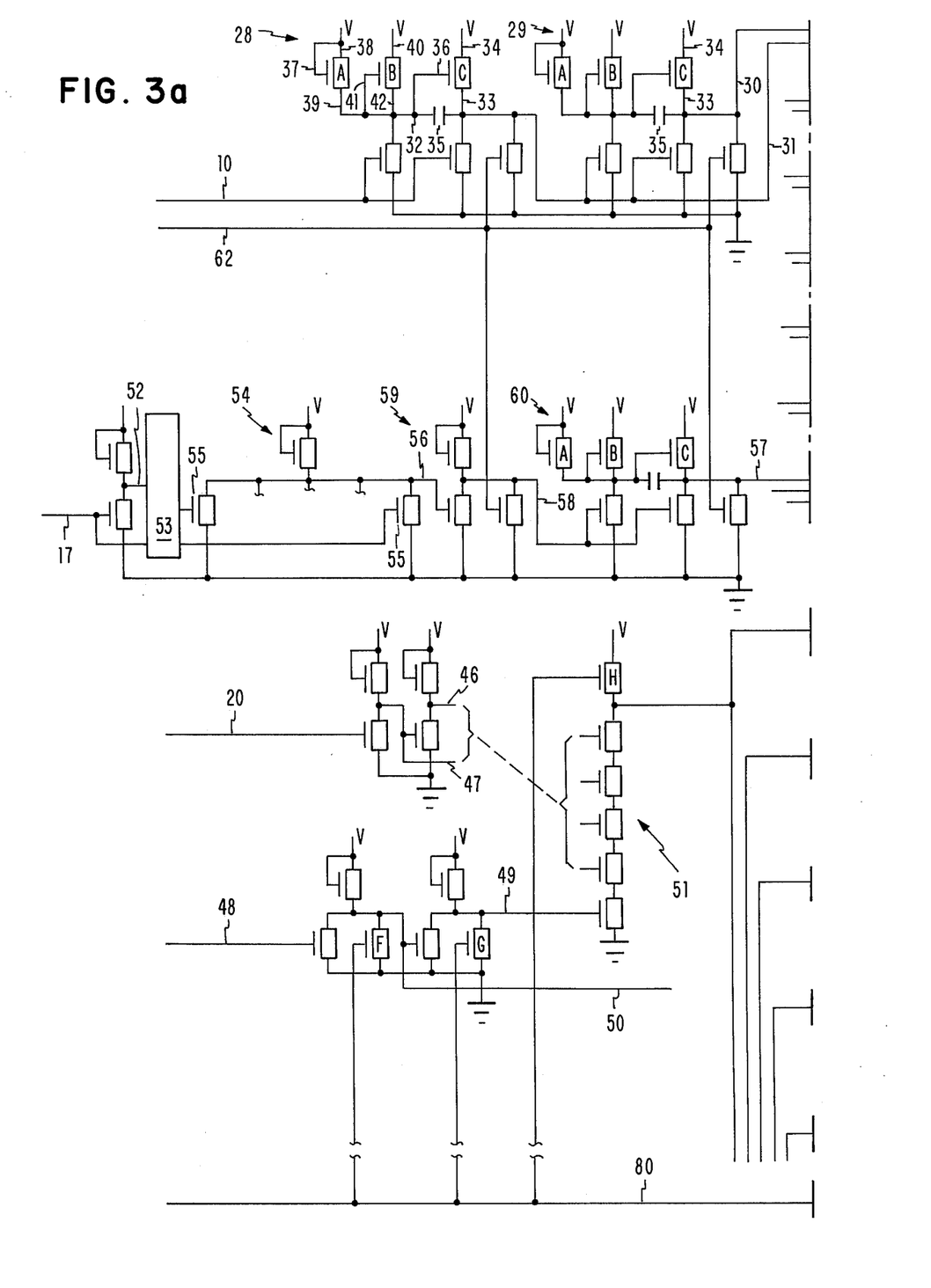

The source decode which serves to select one of 16 source lines to thereby provide the row select of devices within the memory matrix is composed of four address lines 20 one of which is shown in FIGS. 2a and 3a which proceeds through two inversion stages to provide a true value on line 46 and a complement value on line 47 which are directed to a source decode tree to permit one of 16 sets of eight source lines to be connected to ground. Although illustrated schematically as a set of 16 AND blocks 51 for selecting one of the 16 source line sets, the row decide is as the gate decode also a decode tree through which only one of 16 alternate paths is conductive.

The address line 48 permits the selection of the upper and lower half of the memory when operating with eight bit words. If the memory is designed and built to operate with 16 bit word outputs, line 48 is eliminated and this line is utilized as the sixth array address line to enable the selection of 64 rather than 32 arrays. The schematic showing of FIG. 1 shows line 19 directed to circuitry 18 and 21 whereas if the 16 bit option is practiced the line is connected to array decode circuitry 18 and if the 8 bit option is used this address line becomes line 48 of FIGS. 2a and 3a which effects selection of upper or lower array halves. Line 48 goes through a double inversion stage to provide a true output on line 49 which as is shown here enables the upper half of the memory matrix and a complement on line 50 that enables the lower half of the memory matrix.

The memory matrix as shown in FIGS. 2 and 3 is formed of the matrix of FET devices in 192 columns and 256 rows. Each device represents a bit position which, upon being addressed, indicates a logical one at the corresponding output when a gate is present and a logical zero if a gate is not present. The array is personalized at the time of fabrication by forming a thin oxide gate at the selected locations where a logical one is desired using metal oxide semiconductor (MOS) technology. This manner of fabrication is shown more completely in the copending application, Ser. No. 539,904, filed Jan. 9, 1975 and assigned to the same assignee.

Also personalized at time of fabrication is the array decode which provides which of the 32 or 64 possible address combinations are used to select the three arrays of the matrix on the associated large scale integration chip.

The address lines 17 (plus the address line 19 where the 16 bit word length option is used) each are connected to an inverter circuit to generate a complement value on line 52 whereupon both lines 17 and 52 are connected to binary selection circuitry 53. The output of circuitry 53 is connected to the NOR 54 which controls one of the array select lines 16. If all NOR gates are at a down level, an up level appears on line 56 indicating that the array 1 enabled by line 57 (which is one of the lines 16) is selected. The plus or up level on line 56 causes a down level on line 58 through the action of a first inverter 59 and a second inverter 60 causes the positive signal on line 57. The NOR 54 and inverters 59 and 60 are repeater for each of the three array select lines 16. A restart pulse on line 62 is supplied during an early portion of each memory cycle to devices which respectively form a portion of inverters 28, 29, 59 and 60 to assure the functioning of the bootstrapped circuits of those circuits.

Figure 2C:
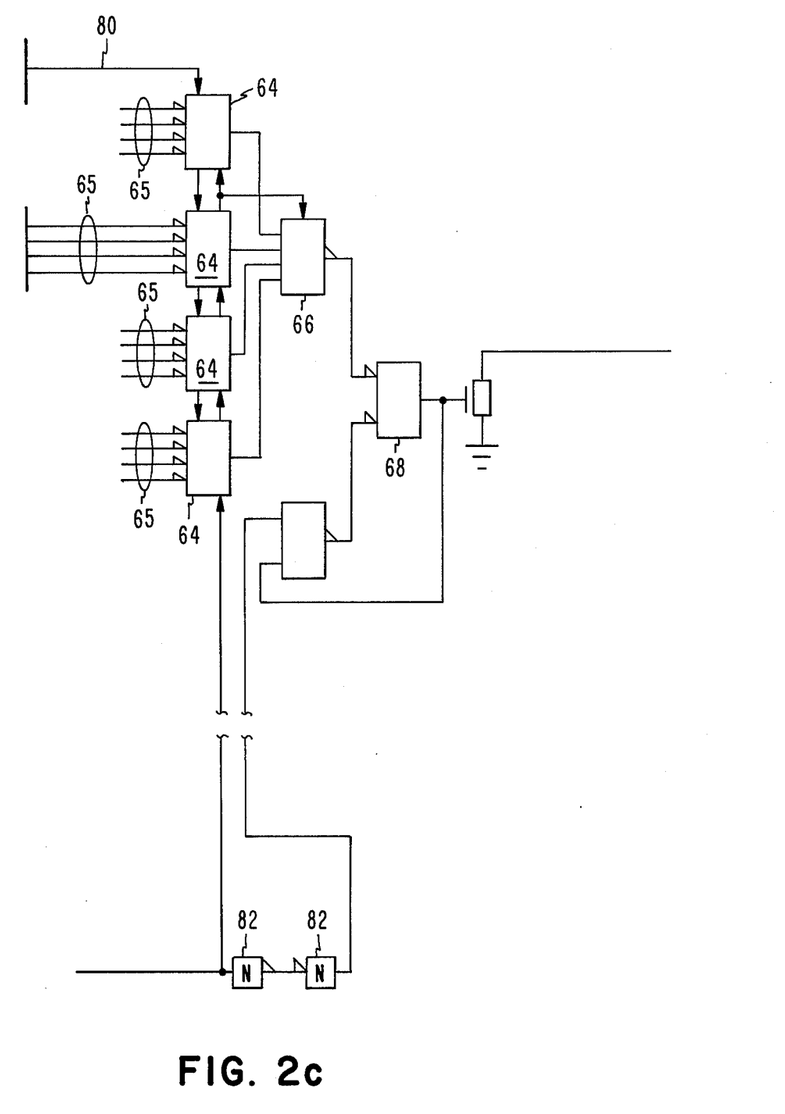

The source lines which select the rows of FET devices within the matrix extend between alternate rows and are connected to devices in both adjoining rows. At the side of the row opposite the source line each row is connected to a sense line. Each sense line extends to one of the 16 sense circuits illustrated in FIGS. 2c and 3c.

Figure 3C:
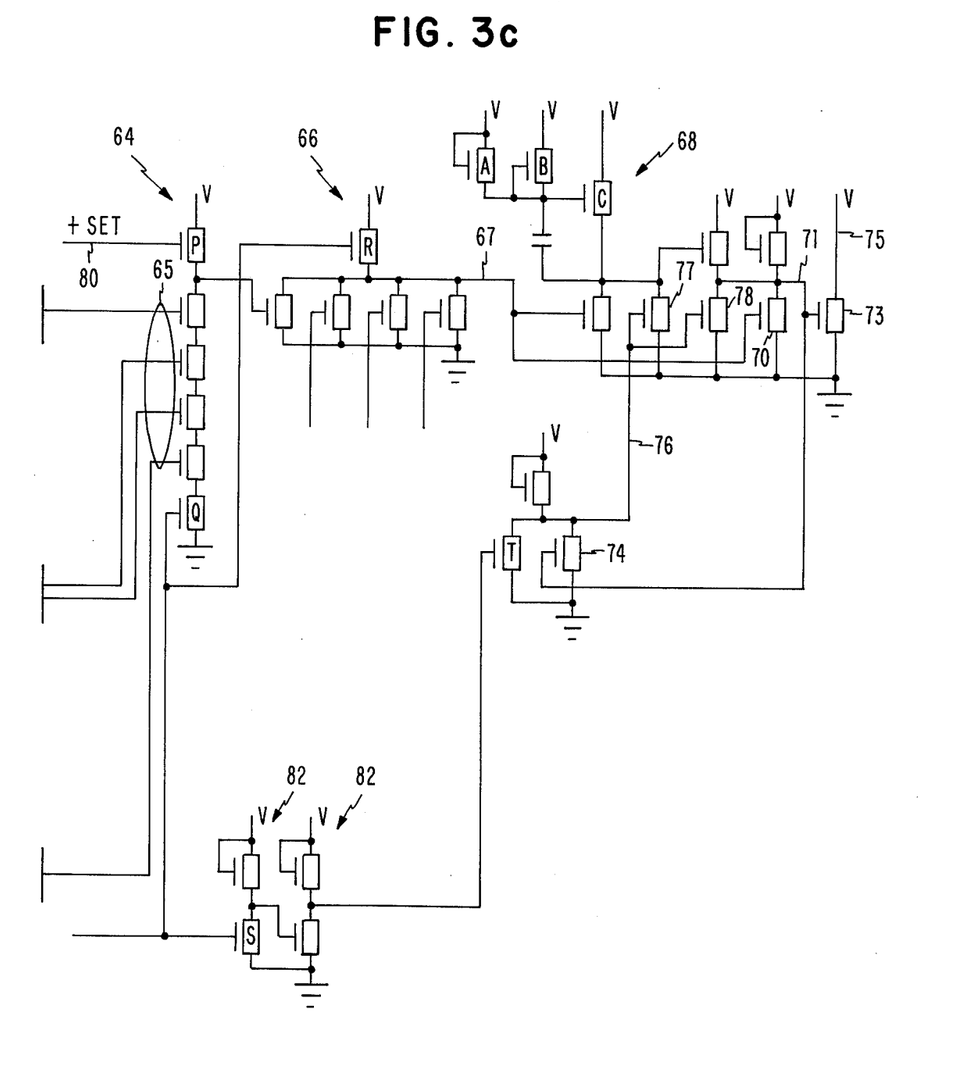

Each sensing circuit receives the output rom 16 sense lines. This is accomplished by connecting four sense lines 65 to each of four dynamic collection NANDs 64, only one of which is shown in FIG. 3c. The output of the four collection NANDs 64 is connected to a collection NOR 66 which provides an output on line 67. The output on line 67 is supplied to a static output latch circuit which is stabilized by a clamped, boot-strapped predriver 68 utilizing FET elements A, B and C which is identical to the circuits utilized to stabilize the column gate decode address lines. When a gate is present at the addressed or sensed location, a down signal on line 67 causes device 70 to be nonconductive producing an up level on line 71 inducing both devices 73 and 74 to become conductive. The conductive condition of device 73 causes output line 75 to be at a down level or ground potential which is indicative of the logical one at the matrix location sensed. The conductivity of device 74 causes line 76 to be at a down level whereupon devices 77 and 78 are maintained nonconductive to maintain line 71 at an up level and the output line at the corresponding down level until the next memory access during the subsequent memory cycle. In like manner, if the address location sensed does not have a device present, all sense lines 65 have an up level and all input lines to NOR 66 are down causing line 67 to have an up level, line 71 a down level and output line 75 and up level indicative of a logical zero which is maintained by the polarity hold circuit until the next memory access cycle.

Figure 5:
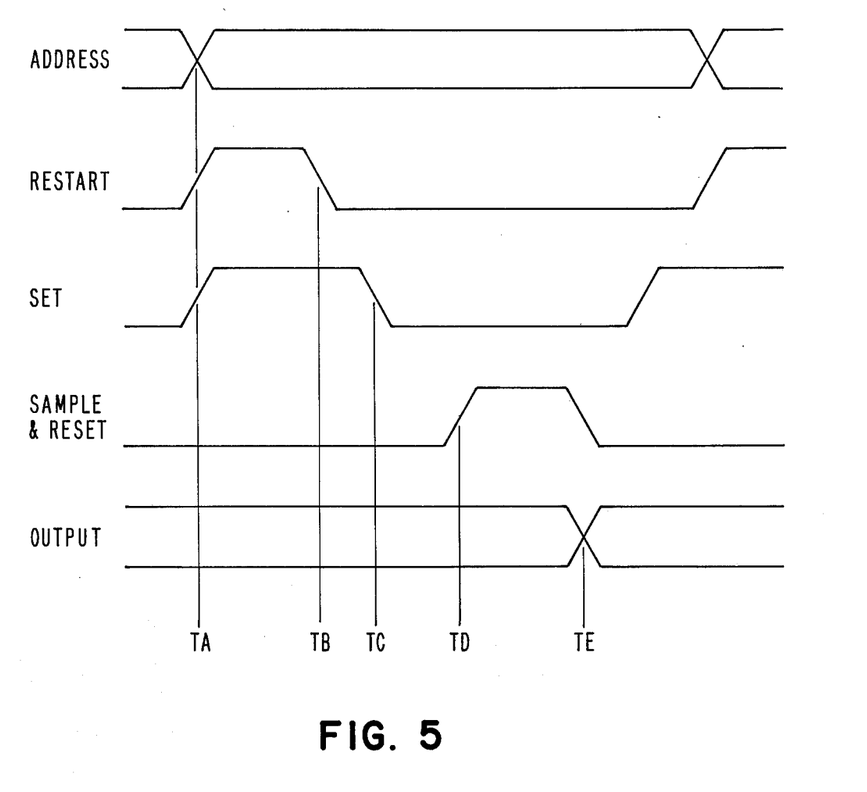
FIG. 5 is a timing diagram showing the clock relationships of the dynamic circuit portions.

The timings for a memory cycle as shown in FIG. 5 wherein the 12 address lines (10, 17, 19 and 20) are valid from the start of the cycle at TA. A restart pulse from TA to TB on line 62 assures the timely operation of the boot-strapped circuits and a set pulse or up level occurs between TA and TC, such plus set signal on line 80 causes devices F and G to become active in the embodiment where eight bit outputs are utilized necessitating the selection of the upper or lower halves of the matrix. Line 80 also activates device H to make the source decodes active. The signal on line 80 further causes the devices M to be active charging the array and the activation of the devices J causes any residual charge in the gate decode tree to be discharged. The plus set signal on line 80 is also supplied to the devices P of the dynamic collection NANDs 64 in the output sense circuits.

The polarity hold output is set by a plus sample and reset signal on line 81 between times TD and TE which functions to cause devices Q in the dynamic collection NANDs 64 to be active, the devices R in the dynamic collection NORS to be active and also activates device S in the double inversion stages 82 which cause device T to be active thereby resetting the polarity hold circuit in accordance with the bit location sensed during the current memory access cycle. The double inverter circuits 82 are utilized to generate two logic delays before activating the polarity hold latch circuit. The dynamic signals supplied from the selected bit location over the corresponding sense line 65 to the dynamic collection NAND 64 and through the dynamic collection NOR 66 is utilized to condition the static output latch or polarity hold circuit at time TE which then causes the output on line 75 to remain valid until reset at time TE during the next memory access cycle thereby enabling the dynamic array circuitry to interface with the static circuits of other devices which receive the output signal.

While the invention has been particularly shown and described with reference to a preferred embodiment thereof, it will be understood by those skilled in the art that various changes in form and details may be made therein without departing from the spirit and scope of the invention.

What is claimed is:

1. A solid state read only memory unit comprising;
a plurality of bit locations arranged as a matrix of rows and columns of field effect transistor (FET) devices wherein a first logic level is indicated when a gate connection is present and a second logic level is indicated when a gate connection is absent and wherein each FET device includes first and second electrodes connected to the source and drain thereof and a gate which may enable transistor action when a gate connection is present;
first addressing means for addressing a selected column of said matrix of FET devices;
second addressing means for addressing a selected row of said matrix of FET devices;
said first addressing means and said second addressing means cooperating to identify a selected matrix bit location at the intersection of said selected column and said selected row;
clocked sensing means including a dynamic NAND circuit which senses a plurality of array drain lines during each memory cycle for sensing the logic level at said selected matrix bit location; and
static output latch means which is conditioned by said clocked sensing means and retains the logic level sensed at said selected matrix bit location until reset during a subsequent memory cycle.

2. The solid state read only memory unit of claim 1 wherein said static output latch means comprises a polarity hold circuit dynamically conditioned by said clocked sensing means.

3. The solid state read only memory unit of claim 2 wherein said clocked sensing means further includes a collection NOR for sensing the output from a plurality of dynamic NAND circuits during each memory cycle.

4. The solid state read only memory unit of claim 2 wherein said static output sense latch means further comprises a clamped, boot-strapped predriver including
a first voltage;
a first FET having an output electrode, a second electrode connected to said first voltage and a gate electrode;
capacitor means connected between said first FET gate electrode and output electrode;
first switch means connected to said first voltage and said first FET gate electrode; and
voltage clamping circuit means interconnecting said first voltage and said first FET gate electrode.

5. The solid state read only memory unit of claim 4 wherein said first switch means comprises a second FET device having the gate and drain thereof connected to said first voltage and the source connected to said first FET gate electrode and
said voltage clamping circuit means comprises a third FET having the source connected to said first voltage and the gate and drain thereof connected to said first FET gate electrode.

6. A field effect transistor (FET) driver circuit comprising
a voltage and current source
a first FET having an output electrode, a second electrode connected to said voltage and current source and a gate electrode;

capacitor means connected between said first FET gate electrode and output electrode;

a first switch means connected to said voltage and current source and said first FET gate electrode; and voltage clamping circuit means interconnecting said source of voltage and current source and said first FET gate electrode.

7. The field effect transistor drive circuit of claim 6 wherein said voltage clamping circuit means comprises a second FET device having the source connected to said voltage and current source and the gate and drain thereof connected to said first FET gate electrode.

8. The field effect transistor driver circuit of claim 7 wherein said first switch means comprises a third FET device having the gate and drain thereof connected to said voltage and current source and the source connected to said first FET gate electrode.

* * * * *